(12) United States Patent
Chou

(10) Patent No.: US 8,169,851 B2
(45) Date of Patent: May 1, 2012

(54) MEMORY DEVICE WITH PSEUDO DOUBLE CLOCK SIGNALS AND THE METHOD USING THE SAME

(75) Inventor: Min Chung Chou, Hsinchu (TW)

(73) Assignee: Elite Semiconductor Memory Technology, Hsinchu (TW)

( * ) Notice: Subject to any disclaimer, the term of this patent is extended or adjusted under 35 U.S.C. 154(b) by 279 days.

(21) Appl. No.: 12/713,561

(22) Filed: Feb. 26, 2010

(65) Prior Publication Data

US 2011/0211417 A1 Sep. 1, 2011

(51) Int. Cl.
*G11C 8/00* (2006.01)
(52) U.S. Cl. .......... 365/233.11; 365/233.13; 365/233.19
(58) Field of Classification Search ............. 365/233.11, 365/233.13, 233.19
See application file for complete search history.

(56) References Cited

U.S. PATENT DOCUMENTS

| 5,901,110 A * | 5/1999 | Jang ........................ 365/233.12 |
| 7,042,265 B2 * | 5/2006 | Harrison ....................... 327/271 |
| 7,457,191 B2 | 11/2008 | Lee |

\* cited by examiner

*Primary Examiner* — Son Dinh
(74) *Attorney, Agent, or Firm* — WPAT, P.C.; Anthony King

(57) ABSTRACT

A method for operating a memory device with pseudo double clock signals comprises the steps of: generating an even clock signal and an odd clock signal, wherein the clock rates of both the even clock signal and the odd clock signal are half that of the input clock signal, and the even clock signal is the inverse signal of the odd clock signal; if the logic level of the even clock signal is 1 when receiving a trigger of a control signal, applying the even clock signal to a memory device; and if the logic level of the odd clock signal is 1 when receiving another trigger of the control signal, applying the odd clock signal to the memory device.

12 Claims, 6 Drawing Sheets

MEMORY DEVICE WITH PSEUDO DOUBLE CLOCK SIGNALS AND THE METHOD USING THE SAME

BACKGROUND OF THE INVENTION

1. Field of the Invention

The present invention relates to a memory device, and more particularly, to a memory device with pseudo double clock signals and the method using the same.

2. Description of the Related Art

Traditionally, a dynamic random access memory (DRAM) is a memory device with an asynchronous interface with input control signals. That is, a DRAM device responds to changes in input signals as quickly as possible. However, the pipelining instructions cannot be applied to a DRAM device due to its asynchronous characteristic. Accordingly, a synchronous dynamic random access memory (SDRAM) device with synchronous interface was introduced. An SDRAM device waits for a clock signal before responding to input control signals and is therefore synchronized with a computer's system bus. An SDRAM device utilizes a finite state machine driven by a clock signal to pipeline input instructions.

With the pipelining technique utilized, an SDRAM device is able to accept a new instruction before finishing processing a previously accepted instruction. In a write operation, the write instruction can be immediately followed by another instruction without waiting for the data to be written to the memory array. In a read operation, the requested data appears after a fixed number of clock pulses, and additional instructions can be sent after the read instruction. This kind of delay is called latency and is an important parameter to consider when evaluating the performance of an SDRAM device.

While the access latency of a DRAM device is limited by the DRAM array, to exploit the bandwidth potential of a DRAM device and thus reduce the latency of an SDRAM device, a double data rate (DDR) SDRAM device was introduced. A DDR SDRAM device transfers data on both the rising edge and the falling edge of a clock signal, and thus achieves nearly twice the bandwidth of a traditional SDRAM device with a single data rate. The typical clock rates of a DDR SDRAM device are 100, 133, 166 and 200 MHz.

With the development of memory device technology, a more advanced memory device, DDR2 SDRAM, was introduced. A DDR2 SDRAM device doubles the clock rate of a traditional DDR SDRAM. That is, the typical clock rates of a DDR2 SDRAM device are 200, 266, 333 and 400 MHz.

To meet the clock rate requirement of DDR2 SDRAM standard, the memory controller and other circuit components such as the sense amplifier, row decoder and column decoder may require a redesign, which is a complicated and time consuming process. In addition, the original circuit designs for DDR SDRAM devices may need to be abandoned, which reduces the profit generated from the investment in the design for DDR SDRAM devices. However, in some circumstances, even if a DDR2 SDRAM clock rate is required, a typical DDR SDRAM device may suffice for the system design. In such circumstances, utilizing a DDR2 SDRAM device merely to meet a requirement of the specification may not be cost effective. Therefore, there is a need to design a method for applying an input clock signal to a memory device, wherein the clock rate of the input clock signal is two times that of the memory device, such that a typical DDR SDRAM device can operate under the DDR2 SDRAM clock rate.

SUMMARY OF THE INVENTION

The memory device with pseudo double clock signals according to one embodiment of the present invention comprises a memory cell array, a control signal generator, a clock generator, an even clock controller, an odd clock controller and a functional block. The control signal generator is configured to generate a control signal in response to an input command signal. The clock generator is configured to generate an even clock signal and an odd clock signal, wherein the clock rates of both the even clock signal and the odd clock signal are half that of an input clock signal, and the even clock signal is the inverse signal of the odd clock signal. The even clock controller receives the control signal and the even clock signal. The odd clock controller receives the control signal and the odd clock signal. The functional block operates under a clock rate half that of the input clock signal and is configured to control the access of the memory cell array. The even clock controller is configured to provide the even clock signal to the functional block if the logic level of the even clock signal is 1 when the even clock controller receives a trigger of the control signal. The odd clock controller is configured to provide the odd clock signal to the functional block if the logic level of the odd clock signal is 1 when the odd clock controller receives another trigger of the control signal.

The method for operating a memory device with pseudo double clock signals according to one embodiment of the present invention comprises the steps of: generating an even clock signal and an odd clock signal, wherein the clock rates of both the even clock signal and the odd clock signal are half that of the input clock signal, and the even clock signal is the inverse signal of the odd clock signal; if the logic level of the even clock signal is 1 when receiving a trigger of a control signal, applying the even clock signal to a memory device; and if the logic level of the odd clock signal is 1 when receiving another trigger of the control signal, applying the odd clock signal to the memory device.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
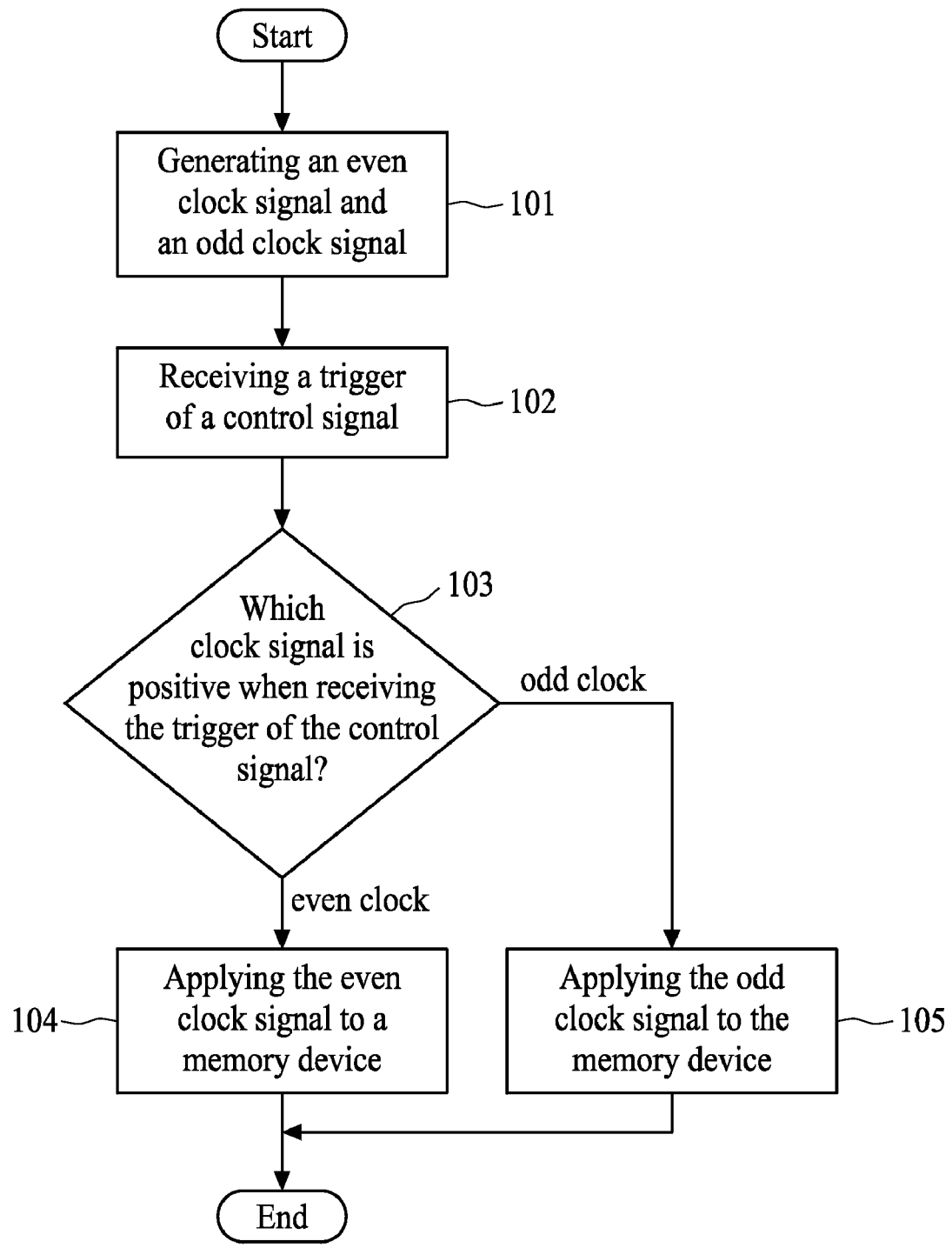
FIG. 1 shows a flow chart of a method for applying an input clock signal to a memory device according to an embodiment of the present invention.

FIG. 1 shows a flow chart of a method for operating a memory device with pseudo double clock signals according to an embodiment of the present invention, wherein the clock rate of the input clock signal is two times that of the memory device. In step 101, an even clock signal and an odd clock signal are generated, wherein the clock rates of both the even clock signal and the odd clock signal are half that of an input clock signal, and the even clock signal is the inverse signal of the odd clock signal. In step 102, a trigger of a control signal is received, wherein in this embodiment, the trigger of the control signal is a rising edge of the control signal. In step 103, it is determined which clock signal is positive when receiving the trigger of the control signal. If the even clock signal is positive when receiving the trigger of the control signal, step 104 is executed. Otherwise, if the odd clock signal is positive when receiving the trigger of the control signal, step 105 is executed. In steps 104 and 105, the even clock signal and odd clock signal are applied to the memory device, respectively.

Figure 2:
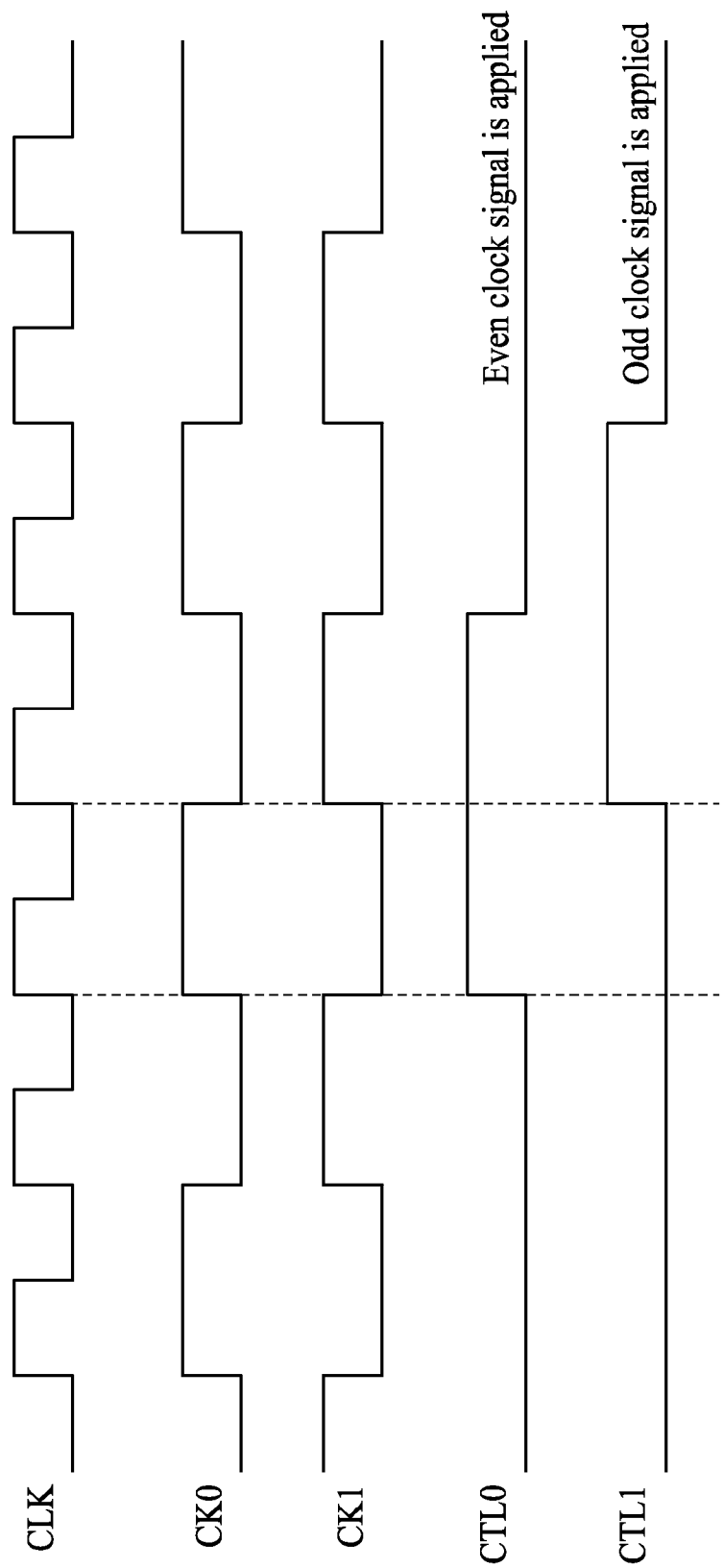
FIG. 2 shows waveforms of signals according to an embodiment of the present invention.

FIG. 2 shows waveforms of the signals illustrated in FIG. 1. As shown in FIG. 2, an input clock signal CLK with clock rate $f_0$ is applied to a memory device, wherein the memory device can only be operated under clock rate $f_0/2$. In step 101, the input clock signal CLK is divided to generate an even clock signal CK0 and an odd clock signal CK1. As shown in FIG. 2, both the even clock signal CK0 and the odd clock signal CK1 exhibit a clock rate $f_0/2$, and the even clock signal CK0 is the inverse signal of the odd clock signal CK1. If a rising edge of a control signal CTL0 is received when the even clock signal CK0 is positive, as shown in FIG. 2, the even clock signal CK0 is applied to the memory device. If a rising edge of another control signal CTL1 is received when the odd clock signal CK1 is positive, as shown in FIG. 2, the odd clock signal CK1 is applied to the memory device.

Figure 3:
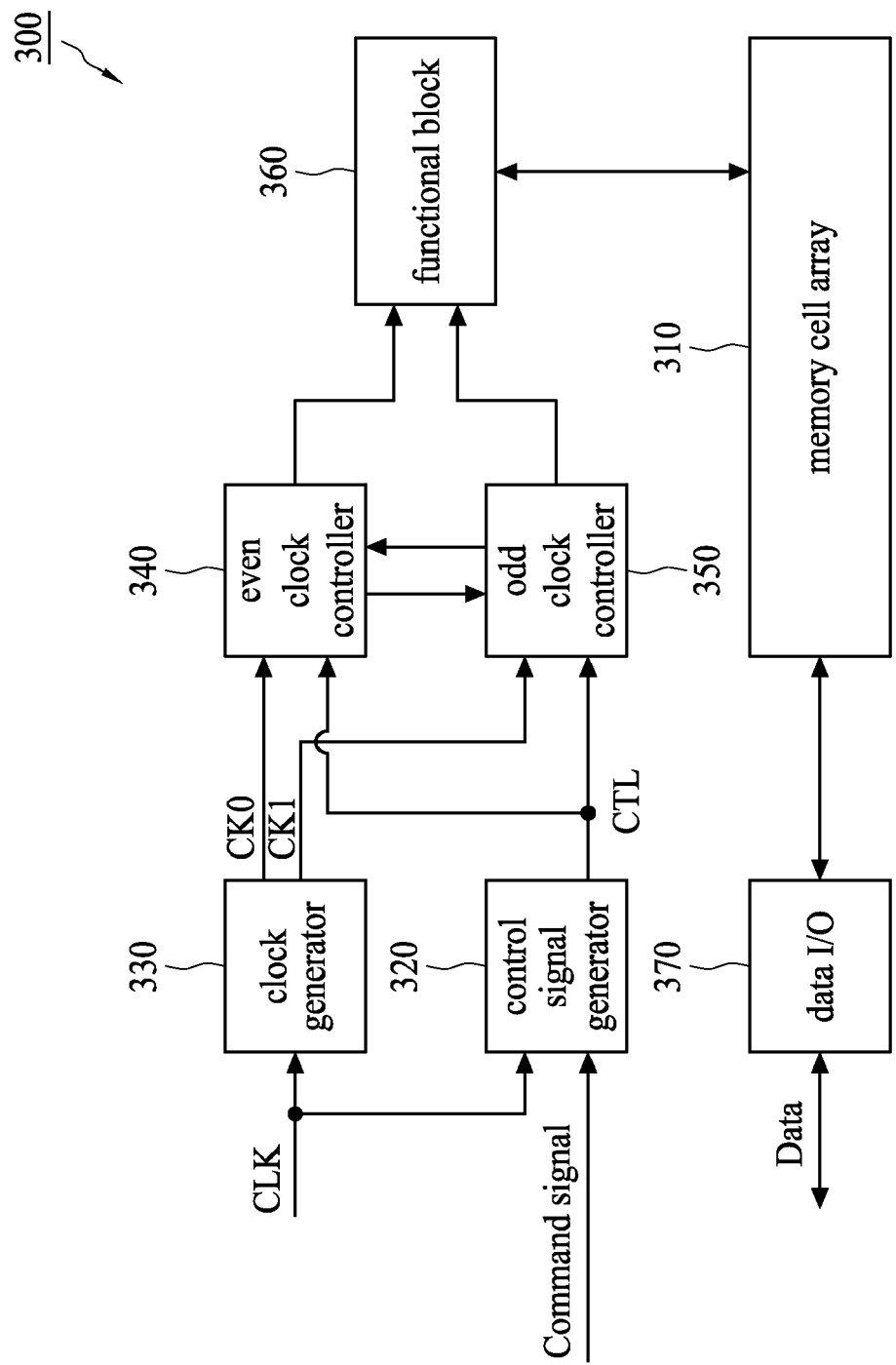
FIG. 3 shows a block diagram of a memory device with pseudo double clock signals according to an embodiment of the present invention.

FIG. 3 shows a block diagram of a memory device with pseudo double clock signals according to an embodiment of the present invention. The memory device 300 comprises a memory cell array 310, a control signal generator 320, a clock generator 330, an even clock controller 340, an odd clock controller 350, a functional block 360 and a data I/O 370. The control signal generator 320 is configured to generate a control signal CTL in response to an input command signal. The clock generator 330 is configured to generate an even clock signal CK0 and an odd clock signal CK1, wherein the clock rates of both the even clock signal CK0 and the odd clock signal CK1 are half that of an input clock signal CLK, and the even clock signal CK0 is the inverse signal of the odd clock signal CK1. The even clock controller 340 receives the control signal CTL and the even clock signal CK0, providing the even clock signal CK0 to the functional block 360, and disables the odd clock controller 350 if the trigger of the control signal CTL is received when the logic level of the even clock signal CK0 is 1. The odd clock controller 350 receives the control signal CTL and the odd clock signal CK1, providing the odd clock signal CK1 to the functional block 360, and disables the even clock controller 340 if the trigger of the control signal CTL is received when the logic level of the odd clock signal CK1 is 1. The functional block 360 operates under a clock rate half that of the input clock signal CLK and is configured to control the access of the memory cell array 310. The data I/O 370 acts as a buffer for the input and output data of the memory cell array 310. The functional block 360 comprises components for the operation of the memory cell array 310, such as a row decoder, a column decoder and a sense amplifier.

As shown in FIG. 3, while the functional block 360 operates under either the even clock signal CK0 or the odd clock signal CK1, wherein the clock rates of both the even clock signal CK0 and the odd clock signal CK1 are $f_0/2$ as shown in FIG. 2, the memory device 300 can be seen as operating under the input clock signal CLK with the clock rate $f_0$. Therefore, the components of the functional block 360 can be implemented by ordinary DDR SDRAM functional blocks, and the memory device 300 can meet the clock rate requirement complying with the DDR2 SDRAM standard.

Figure 4:
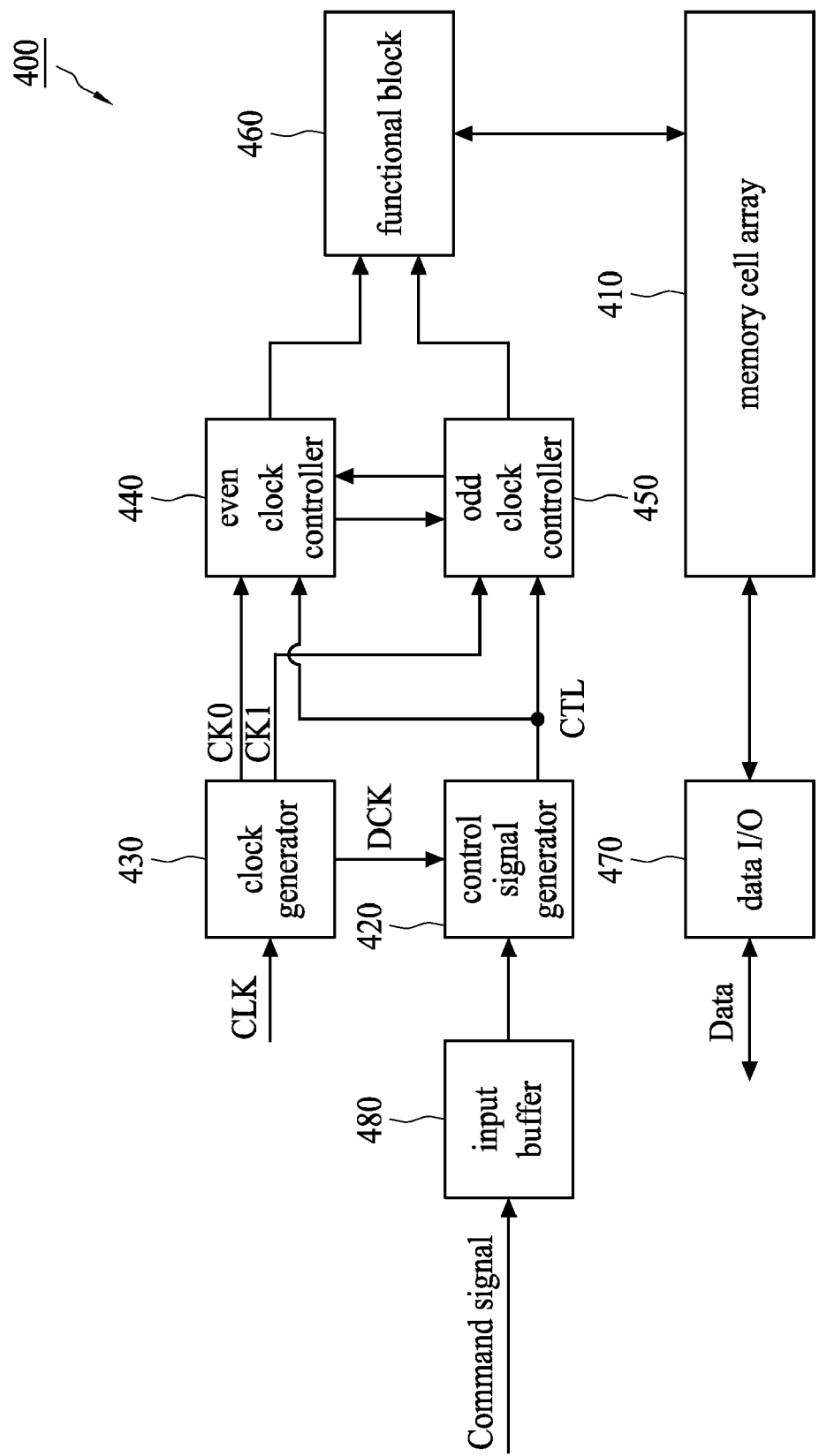
FIG. 4 shows a block diagram of a memory device with pseudo double clock signals according to another embodiment of the present invention.

FIG. 4 shows a block diagram of a memory device with pseudo double clock signals according to another embodiment of the present invention. The memory device 400 is similar to the memory device 300 and comprises a memory cell array 410, a control signal generator 420, a clock generator 430, an even clock controller 440, an odd clock controller 450, a functional block 460, a data I/O 470 and an input data buffer 480. The input data buffer 480 acts as a buffer for the input instructions. To eliminate high speed global signal RC delay at the far end, the clock generator 430 further generates a clock signal DCK, which exhibits the same clock rate but has a phase difference with the input clock signal CLK to eliminate the clock skew problem.

Figure 5:
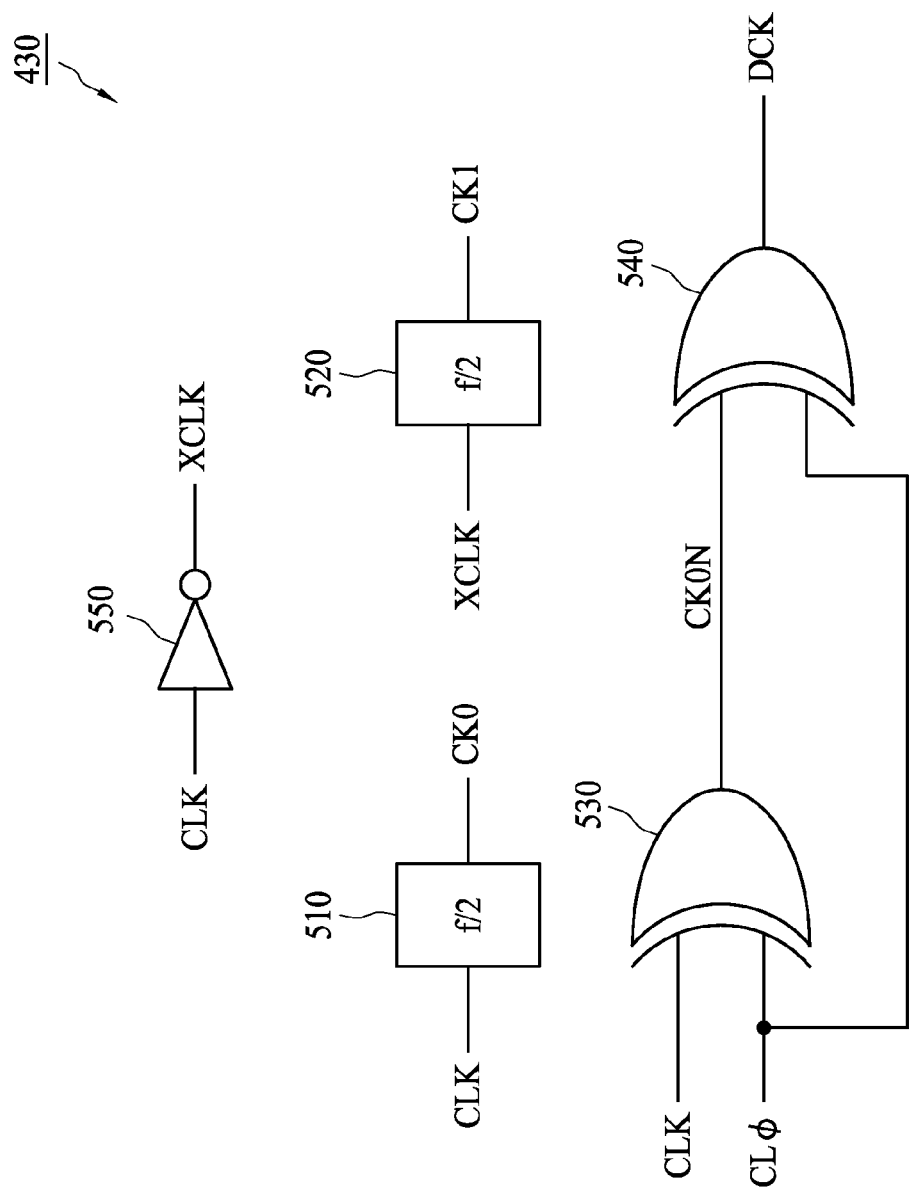
FIG. 5 shows a block diagram of a clock generator according to an embodiment of the present invention.
Figure 6:
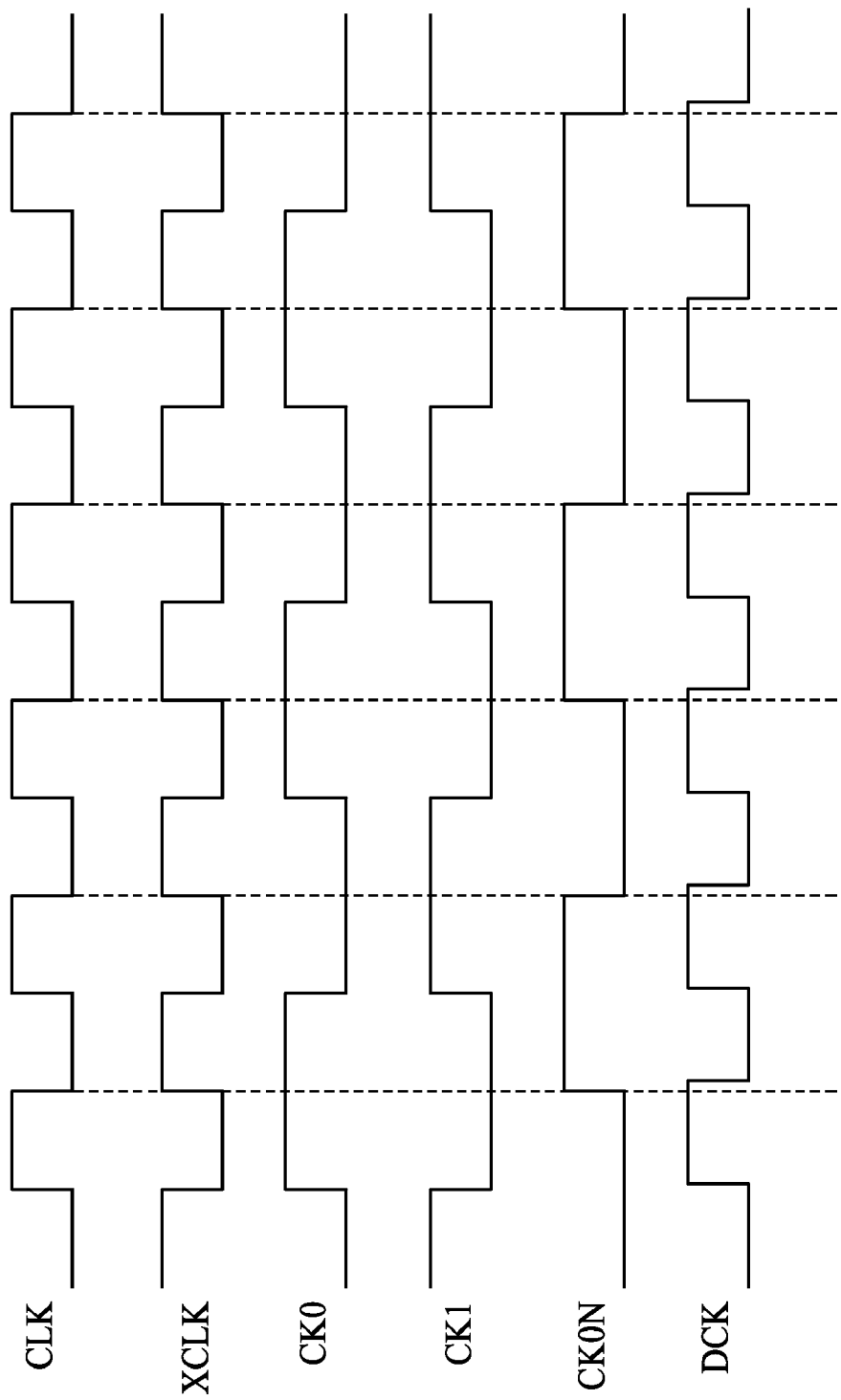
FIG. 6 shows waveforms of signals according to an embodiment of the present invention.

FIG. 5 shows the block diagram of the clock generator 430. The clock generator 430 comprises a first frequency divider 510, a second frequency divider 520, a first exclusive (XOR) gate 530, a second XOR gate 540 and an inverter 550. As shown in FIG. 5, the inverter 550 generates the inverse signal XCLK of the input clock signal CLK. The first frequency divider 510 generates the even clock signal CK0, the second frequency divider 520 generates the odd clock signal CK1, the first XOR gate 530 generates a temporary signal CK0N, and the second XOR gate 540 generates the clock signal DCK. The clock signal DCK exhibits the same clock rate of the input clock signal CLK but with a phase difference resulting from the gate delay of the first XOR gate 530 and the second XOR gate 540. FIG. 6 shows the waveforms of the signals in the clock generator 430. It should be noted that the generated clock signals CK0 and CK1 are both global clock signals and thus both provide a high driving ability, while the generated clock signal DCK is a local clock signal and thus provides a low driving ability.

In conclusion, the circuit design complexity of the memory device is simplified according to the embodiments of the present invention such that the memory device which accepts a certain clock rate can be operated under pseudo double clock signals. Therefore, the tedious work of the redesign of the memory device can be avoided, and the time and cost for the design of the memory device can be reduced.

The above-described embodiments of the present invention are intended to be illustrative only. Those skilled in the art may devise numerous alternative embodiments without departing from the scope of the following claims.

What is claimed is:

1. A memory device with pseudo double clock signals, comprising:
   a memory cell array;
   a control signal generator configured to generate a control signal in response to an input command signal;
   a clock generator, configured to generate an even clock signal and an odd clock signal, wherein clock rates of both the even clock signal and the odd clock signal are half that of an input clock signal, and the even clock signal is inverse to the odd clock signal;
   an even clock controller receiving the control signal and the even clock signal;
   an odd clock controller receiving the control signal and the odd clock signal; and
   a functional block operated under a clock rate half that of the input clock signal and configured to control the access of the memory cell array;
   wherein the even clock controller is configured to provide the even clock signal to the functional block if a logic level of the even clock signal is one when the even clock controller receives a trigger of the control signal;
   wherein the odd clock controller is configured to provide the odd clock signal to the functional block if a logic level of the odd clock signal is one when the odd clock controller receives another trigger of the control signal.

2. The memory device of claim 1, wherein the trigger of the control signal is a rising edge of the control signal.

3. The memory device of claim 1, wherein the even clock controller is configured to disable the odd clock controller if the logic level of the even clock signal is one when the even clock controller receives the trigger of the control signal.

4. The memory device of claim 1, wherein the odd clock controller is configured to disable the even clock controller if the logic level of the odd clock signal is one when the odd clock controller receives the trigger of the control signal.

5. The memory device of claim 1, wherein the clock generator is configured to generate a local clock signal exhibiting the same clock rate as the input clock signal but with a phase difference with the input clock signal.

6. The memory device of claim 1, wherein the functional block comprises a row decoder, a column decoder and a sense amplifier.

7. The memory device of claim 1, which is a double data rate (DDR) synchronous dynamic random access memory (SDRAM) device.

8. The memory device of claim 1, wherein the input clock signal is a DDR2 SDRAM clock signal.

9. A method for operating a memory device with pseudo double clock signals, the method comprising the steps of:
   generating an even clock signal and an odd clock signal, wherein clock rates of both the even clock signal and the odd clock signal are half that of an input clock signal, and the even clock signal is inverse to the odd clock signal;
   operating the memory device by the even clock signal if a logic level of the even clock signal is one when receiving a trigger of a control signal; and
   operating the memory device by the odd clock signal if a logic level of the odd clock signal is one when receiving another trigger of the control signal.

10. The method of claim 9, wherein the trigger and another trigger of the control signal are a rising edge of the control signal.

11. The method of claim 9, wherein the memory device is a DDR SDRAM device.

12. The method of claim 9, wherein the input clock signal is a DDR2 SDRAM clock signal.

* * * * *